United States Patent [19]

Nagy, Jr.

[11] 3,713,136

[45] Jan. 23, 1973

[54] ANALOG-TO-DIGITAL CONVERTERS

[75] Inventor: John Nagy, Jr., Union, N.J.

[73] Assignee: Weston Instruments, Inc., Newark, N.J.

[22] Filed: Sept. 16, 1970

[21] Appl. No.: 72,901

Related U.S. Application Data

[63] Continuation of Ser. No. 661,924, Aug. 21, 1967, which is a continuation-in-part of Ser. No. 642,818, June 1, 1967.

[52] U.S. Cl.............................340/347 NT, 324/99 D

[51] Int. Cl..........................H03k 13/02, H03k 13/20

[58] Field of Search.....340/347 AD, 347 NT; 324/99

[56] References Cited

UNITED STATES PATENTS

| | | | |
|---|---|---|---|
| 3,316,547 | 4/1967 | Ammann | 340/347 NT |
| 2,824,285 | 2/1958 | Hunt | 340/347 NT X |
| 3,458,809 | 7/1969 | Dorey | 340/347 NT X |
| 3,258,764 | 6/1966 | Muniz et al. | 340/347 NT |
| 3,491,295 | 1/1970 | Van Saun | 340/347 NT X |

*Primary Examiner*—Thomas A. Robinson
*Assistant Examiner*—Thomas J. Sloyan
*Attorney*—William R. Sherman, Stewart F. Moore and Jerry M. Presson

[57] ABSTRACT

An analog-to-digital converter of the dual slope integrating type operates without counter reset or input gating circuitry to provide successive, accurate digital readouts representing the average magnitude of corresponding analog input signals. Provision is made to nullify a predetermined number of transient waveforms which may be produced as an undesired by-product of dispensing with such circuitry. The converter employs a buffer storage register to receive and store the digital contents of a counter, which contents represent the average magnitude of the analog input signal. The storage register provides a digital readout, typically in the form of a visual display, which persists at least for a time interval which starts at the termination of one complete analog-to-digital conversion cycle and extends to the termination of a succeeding conversion cycle. In accordance with yet another aspect of this invention to polarity reversals of the analog signal, an offset current of constant magnitude is applied as an additional input signal to the integrator of the converter and appropriate compensation for that value of offset current is provided by the counter so that the display provides an indication only of the value of the analog input signal.

11 Claims, 4 Drawing Figures

INVENTOR.
John Nagy. Jr.
BY J.M. Presson
ATTORNEY

ANALOG-TO-DIGITAL CONVERTERS

This application is a continuation application of abandoned application Ser. No. 661,924, filed Aug. 21, 1967, and the latter application is a continuation-in-part application of abandoned application Ser. No. 642,818, filed June 1, 1967.

This invention relates generally to analog-to-digital converters and, more particularly, to solid state digital voltmeters of the dual-slope integrating type.

Various embodiments of digital voltmeters of the dual-slope integrating type are disclosed by, for example, U.S. Pat. No. 3,051,939 and 3,316,547. This type of voltmeter typically includes an integrator-amplifier having a current summing junction that receives an analog input signal during one time period of voltmeter operation and a precision reference current (with or without the analog input signal depending upon the particular voltmeter circuit) during a second time interval of operation. Both intervals of conversion are timed by a counter driven from a suitable source of timing signals. Typically, the counter is a pulse counter and the timing signal source is an oscillator.

The integrator-amplifier typically comprises an operational amplifier having a high negative voltage gain with an integrating capacitor in a negative feedback circuit connecting the output terminal of the amplifier to the summing junction. With the integrator-amplifier receiving the analog input signal, for a known, fixed time period, the capacitor charges at a rate proportional to the magnitude of the input signal and produces a voltage at the amplifier output terminal which forms the first ramp of a sawtooth waveform having a slope proportional to the analog signal magnitude. The first ramp may be a positive-going or negative-going voltage depending upon the voltage polarity of the analog input signal. The precision current source of known, fixed magnitude and of opposite polarity to the analog signal is coupled to the summing junction typically a fixed period of time after the initiation of the generation of the first ramp and causes the capacitor to discharge at a rate controlled at least in part by the oppositely directed reference current.

The discharging of the capacitor forms a second ramp of directionally opposite slope to the first ramp and the capacitor discharging continues until the second ramp crosses a pre-established datum or reference level, typically ground potential. The time required for the capacitor to discharge to this reference level is timed by constant frequency pulses generated by the oscillator, these pulses being supplied to, and temporarily stored in the pulse counter. Since the period during which the analog signal is sampled by the integrating means is known and fixed and the magnitude of the reference signal is likewise known and fixed by timing the interval required to drive the second ramp of each sawtooth waveform to the datum or reference level, the pulse count stored in the counter at the termination of this interval will be a function of the average magnitude of the analog input signal. Inasmuch as two continuous slopes are produced by the two time integrations of the unknown and reference signals applied to the integrating means during each cycle of analog-to-digital conversion, the hereinabove-described digital voltmeter is often referred to by those in the art as being of the "dual-slope integrating type".

The operational amplifier used in integrator-amplifier circuits of conventional voltmeters may be driven into or near saturation if the voltmeter is not operating and if the summing junction remains connected to the source of the analog input signal. Thus, when the voltmeter is subsequently put into operation, the amplifier must recover from a state of saturation or near saturation. In recovering, transient voltages are introduced into the first few sawtooth waveforms of the amplifier output voltage with the result that these waveforms deviate from a sawtooth waveform which exactly represents the time integral of the analog input signal. In order to prevent the amplifier from being driven into or near saturation during periods when the voltmeter is not actually performing an analog-to-digital conversion of the analog input signal, the summing junction of the integrator-amplifier is often disconnected from the input signal source. The connection and disconnection of the summing junction to and from the input signal source is generally effected through the use of solid state gates or switches and associated circuitry.

Conventional digital voltmeters of the specified type oftentimes employ reset circuitry to effect the resetting of the counter at least immediately prior to the initiation of the second ramp of the sawtooth waveform, thus permitting the counter to very accurately record the time required to generate the second ramp in the form of a pulse count in a single conversion cycle. In certain embodiments these voltmeters, the counter is reset by the counter reset circuitry coincidentally with the initiation of the first ramp or coincidentally with the first ramp crossing a preestablished voltage level during the integration of the analog input signal. The counter, driven by pulses from the oscillator, proceeds to count these pulses until its full scale count capacity is reached, whereupon it produces a signal that triggers the coupling of the precision current source to the input of the integrator-amplifier. Thus, the generation of the second ramp is initiated a precise predetermined period of time after the initiation of the first ramp or after the first ramp reaches its pre-established voltage level which establishes a relatively precise time correspondence between a point on the first ramp waveform and the representative pulse count in the counter and advantageously results in a highly accurate conversion within the time frame of a single conversion cycle.

In the analog-to-digital converter disclosed in my aforementioned application Ser. No. 642,818, a counter receiving ramp timing pulses from an oscillator is utilized to periodically trigger the initiation of the second ramp of each sawtooth waveform. The counter, in turn, drives a readout apparatus which typically takes the form of a gas (NIXIE) tube type of display. To minimize the amount of circuitry and components required in the voltmeter of my aforementioned application, buffer storage units are dispensed with and the gas tube display is coupled at all times (through appropriate decoding circuitry) to receive the pulse count output of the counter. Thus, the display is driven constantly during every conversion cycle at the frequency of the counter. At the termination of the conversion cycle, the counter is allowed to stabilize and provide persistent digital driving voltages to the display, these digital voltages representing, for example, in binary-coded form the number of pulses registered in the counter at that time.

It will be understood that the terms "complete conversion cycle" or "complete analog-to-digital conversion cycle" as used herein is derived from my aforementioned application Ser. No. 642,818 and refers to the fact that a complete conversion cycle may include two or more individual but continuous, substantially sawtooth waveforms. To satisfy certain commercial requirements which impose rigid time limits on the total length of time available for a complete conversion cycle and a display, in order to allow a maximum length of display time it may be necessary to provide a display during a portion of, or preferably during the entire time period of, a complete conversion cycle.

In addition to the rigid time limitation which may be placed on the conversion and display periods, for certain applications, particularly when the voltmeter is to be used in a laboratory, it may be required that the voltmeter provide a resolution of the displayed decimal number to five or more decimal places thus necessitating a counter having five or more decade counting stages. However, since in my digital voltmeter each stage of the counter also typically operates as a divide-by-ten divider for the pulses produced by the oscillator, for every stage that is added to the counter to provide the desired multidigit resolution (and assuming all other relevant factors remain constant), the repetition rate of the oscillator must be increased by a factor of 10 to nullify the division by ten performed by each added decade counter stage. Practical considerations such as cost, accuracy of conversion and stability of operation dictate that, if possible, the repetition rate of the oscillator not be increased to the high repetition rates required to drive, for example, five or more counter stages to provide the desired conversion and display within rigidly prescribed, relatively short time intervals.

It is an object of this invention to provide a new and improved analog-to-digital converter of the dual-slope integrating type.

Another object of this invention to provide an analog-to-digital converter of the dual-slope integrating type which operates accurately without requiring counter reset or input gating circuitry and, moreover, utilizes considerably less complex means to nullify transient waveforms which may be produced as an undesired byproduct of dispensing with such circuitry.

Another object of this invention is to provide an analog-to-digital converter of the dual-slope integrating type which appropriately compensates a pulse counting operation to provide the converter with a predetermined latitude to reversals in voltage polarity of the analog input signal.

A further object of this invention is to provide an analog-to-digital converter of the dual-slope integrating type utilizing a control system including a pulse counter, the control system being compensated for the digital value attributable to an offset signal applied to the converter input so that the digital output available from the counter represents only the analog signal magnitude.

Still another object of this invention is to provide a solid state digital voltmeter of the dual-slope integrating type which contains only a few components and may be manufactured at low cost.

Yet another object of this invention is a low-cost solid state digital voltmeter of the dual-slope integrating type that operates without counter reset or input gating circuitry to provide an accurate and persistent digital display of the average magnitude of an analog input signal, the display persisting for at least the time period of the next complete analog-to-digital conversion cycle.

SUMMARY OF INVENTIONS

According to one aspect of this invention an analog-to-digital converter is provided which includes an integrator for generating a plurality of output signals of sawtooth voltage waveform, each waveform being formed by first and second ramps of opposite slope. The ratio of the time interval of the second ramp to the period of each sawtooth waveform is a function of the average input signal applied to the integrator during at least the time period of first ramping and, more particularly, during the entire waveform time period. A pulse counter is initially connected to receive ramp timing pulses from a time-base generator and includes at least one counting stage that provides a digital output representative of the number of sequential pulses received by the counter. The frequency of the time-base generator is high enough so that the counting stage produces a recurring series of digital outputs as a result of undergoing a series of full-scale recyclings within the time period prescribed for each first ramping.

The series of digital outputs from the counting stage drives a binary divider, for example, a divide-by-eight binary divider which establishes the nominal time ratio of the waveform period to the time interval of its corresponding second ramp at the ratio of 8:1. This binary divider produces an output signal for a given number of successive digital outputs from the counting stage, in this instance 8, and the output signals from the binary divider are applied successively to one input terminal of a dual-input bistable comparator, the other comparator input terminal being connected to receive the voltage output of the integrator. The comparator is driven into one of its two states upon receiving each successive output signal from the binary divider and produces a corresponding succession of first comparator output signals which effect the successive coupling of the integrator input to a second input signal of opposite polarity and of sufficient magnitude to successively terminate the generation of the first ramp and initiate the generation of the second ramp of each sawtooth waveform. The comparator is driven into its other stable state and produces a second output signal every time the second ramp of each waveform crosses a reference signal level, typically zero volts. The second comparator output signals produced by successive zero volt crossings of each second ramp effect the successive decoupling of the second input signal from the integrator thereby terminating the generation of the second ramp of each sawtooth waveform.

Another binary divider is driven by the succession of second comparator output signals and, in turn, produces one output signal upon receiving a predetermined number of successive second comparator output signals, for example, four of each signals. The output signal from this binary divider triggers (1) the disconnection of the time-base generator from the counter whereupon the counter stabilizes to provide a digital output representative of the average magnitude of the analog input signal and (2) the transfer and subsequent storage of the counter contents for a time interval which is at least as long as that required by a successive complete conversion cycle. Transient waveforms which may be generated during the first two or three conversion cycles are nullified automatically through the use of this binary divider.

According to yet another aspect of this invention an offset current is applied as an additional input to the integrator of a dual-slope converter for a fixed time period and provision is made to compensate for this offset such that the digital output from the converter is a digital representation of only the analog signal magnitude. Thus, an integrator of a dual-slope meter may be offset without that offset appearing in the digital display of the analog signal.

For a better understanding of the present invention, together with other and further objects thereof, reference may be had to the following description taken in conjunction with the accompanying drawings, the scope of the invention being pointed out in the appended claims.

Referring to the drawings:

FIG. 1 illustrates diagrammatically a digital voltmeter constructed in accordance with this invention;

FIG. 2A–2J, inclusive, illustrate typical voltage waveforms produced by the digital voltmeter of this invention during one complete analog-to-digital conversion cycle, the waveforms being lettered to correspond to similarly lettered connections in the voltmeter circuit of FIG. 1;

FIG. 2K illustrates the persistent decimal number display produced by the instant voltmeter;

FIG. 3A–3I, inclusive, illustrate on a larger time scale typical voltage waveforms produced during a representative sub cycle of a complete analog-to-digital conversion cycle, these waveforms being produced after the digital voltmeter of FIG. 1 has attained a steady state condition of operation;

FIG. 3L graphically depicts the counting operation of a decade counter that is embodied in the voltmeter of this invention with assumed values of analog input signal and offset current; and FIG. 4 illustrates an enlargement of the typical sawtooth waveforms depicted in FIG. 2H, for comparison, illustrates four corresponding but ideal sawtooth waveforms overlayed on the typical waveforms.

DETAILED DESCRIPTION OF INVENTION

Figure 1:
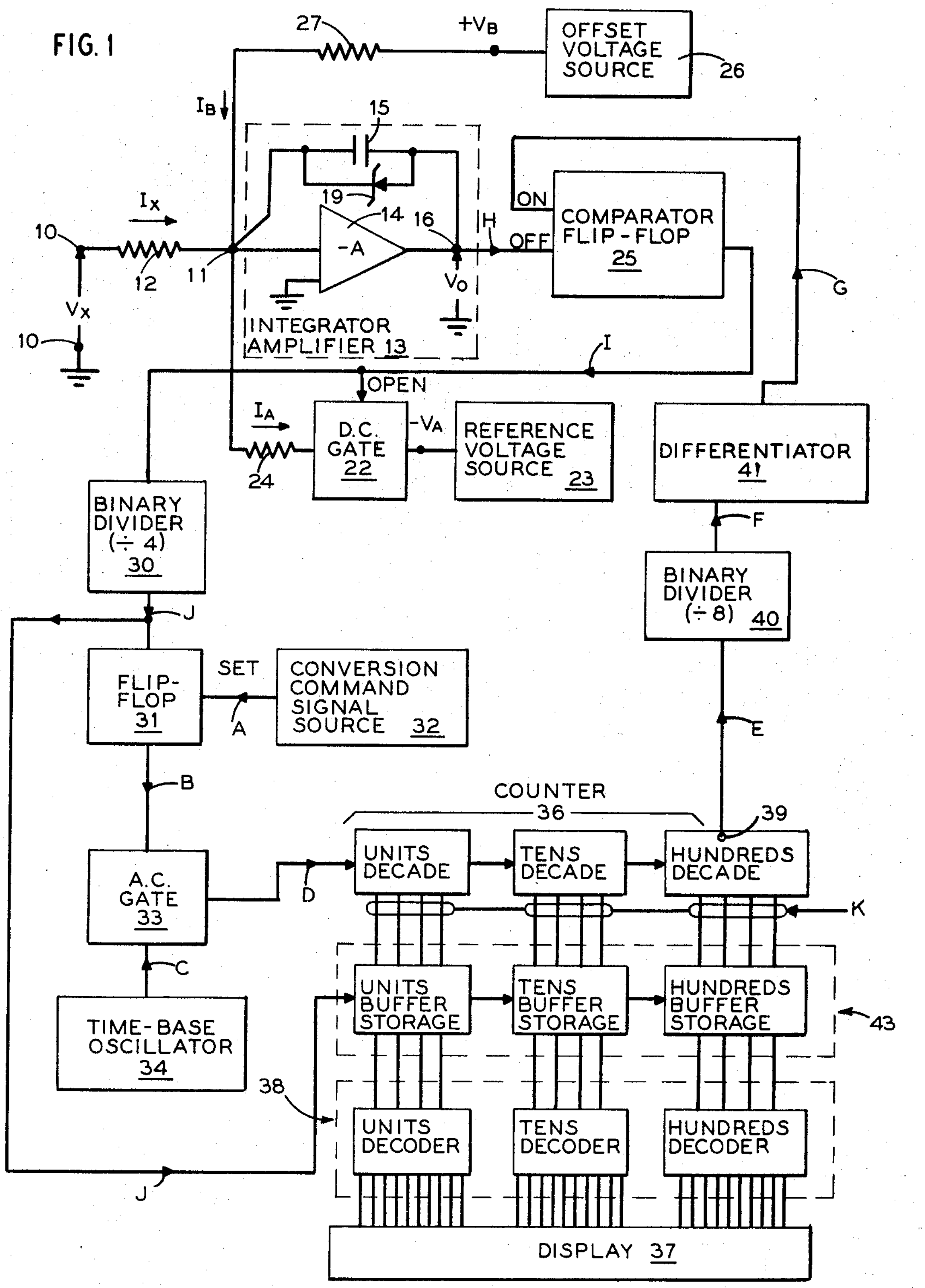

Referring to FIG. 1, there is shown a digital voltmeter of the dual slope integrating type that is capable of converting an analog input signal into digitized form. The analog input signal may be an analog voltage $V_x$ of unknown amplitude which is applied with indicated polarity to voltmeter input terminals 10, 10. The positive terminal 10 is connected to a current summing junction 11 through an input resistor 12, the analog current flowing through the resistor 12 being designated $I_x$. The terminals 10, 10 may be continuously connected to the output terminals of any suitable voltage source capable of producing an analog voltage $V_x$. Obviously, if the signal source is a current source rather than a voltage source, the resistor 12 could be removed from the input circuit and the analog input current fed directly to the junction 11.

The junction 11 also forms a signal inverting terminal of a conventional integrator-amplifier 13. The integrator-amplifier 13 includes an operational or D.C. amplifier 14 characterized as having a high negative voltage gain. The amplifier 14 is illustrated as being double-ended in that its signal noninverting input terminal is connected to ground. However, the amplifier 13 may also be single-ended, that is, formed with only a signal inverting input terminal. The integrator-amplifier 13 also includes an integrating capacitor 15 having one plate connected to the junction 11 and the other plate connected to amplifier output terminal 16. The integrated output voltage which appears at the terminal 16 is designated $V_o$. Because the amplifier 14 has a high negative voltage gain when the voltage $V_x$ is slightly positive with respect to ground potential, the voltage $V_o$ will tend to go highly negative.

If the voltmeter is in an inoperative state, the continuous application of a small positive voltage to the junction 11 will drive the voltage $V_o$ increasingly negative until the amplifier 14 saturates from which state it must immediately recover when the voltmeter is subsequently placed into operation. To prevent the amplifier 14 from being driven into saturation during these periods, a Zener diode 19 having a known reverse-breakdown voltage is included in the negative feedback circuit of the amplifier. The cathode of diode 19 is connected to the junction 11 and the anode of this diode is connected to the terminal 16. By selecting a Zener diode which breaks down when its anode voltage goes slightly more negative than the maximum negative value attained by the voltage $V_o$ with a full scale analog input signal, the diode 19 will clamp the terminal 16 at this slightly more negative voltage level and prevent saturation of the amplifier 14.

Each sawtooth voltage waveform is formed by first and second ramps of opposite slope and intersecting to form a point of waveform inflection, the second ramp of each sawtooth waveform being generated by discharging of the capacitor 15. The discharge of this capacitor is effected through the opening of a D.C. gate 22 which, upon opening, causes a flow of reference current $I_A$ from the junction 11. The current $I_A$ is derived from a constant-magnitude negative reference voltage source 23 in an interruptable series connection via the gate 22 with a resistor 24 having one end thereof connected to the junction 11. The constant-magnitude voltage produced by the source 23 is designated $-V_A$ and to facilitate the understanding of this invention the voltage $V_A$ may be normalized or made equivalent to the analog input voltage $V_x$ through the well-known expedient of assuming that the resistance values of the resistors 12 and 24 are equal. However, it will be appreciated that it is the reference current $I_A$ which is instrumental in forming the second ramp of the integrator output voltage and that this current is more typically derived from a precision or reference current source.

The source 23 has a polarity which is opposite that of the analog input signal $V_x$ and provides a current $I_A$ having a magnitude which is greater than the algebraic sum of all other currents which are applied to the junction 11. When the current $I_A$ is applied to the junction 11, the junction 11 tends to go increasingly negative but because the junction 11 is maintained at virtually ground potential by the high negative gain of the amplifier 14, the integrator output voltage $V_o$ is driven increasingly positive and finally back to the preestablished ground potential level, thereby terminating the generation of the second ramp of the sawtooth waveform.

The D.C. gate 22 may comprise a conventional coincidence gate which is fully enabled by the simultaneous application of a negative voltage to one of its input terminals by the source 23 and a positive voltage pulse to its other input terminal designated OPEN. The positive enabling pulse is received from a comparator flip-flop 25 as a result of the second ramp of the voltage $V_o$ crossing ground potential. The removal of the positive voltage pulse from the OPEN terminal disables the gate 22 which decouples the source 23 from the junction 11. Thus, the pulse width of the positive pulse which is applied to the gate 22 establishes the time period when the source 23 is connected to the junction 11. For reasons well known to those working in this art and disclosed, for example, in U.S. Pat. No. 3,051,939, the ratio of the time during which the gate 22 is open to the period during which the analog signal is integrated is proportional to the average magnitude of the input signal. The source 23 may comprise a battery having a positive plate connected at ground and a negative plate connected to the corresponding input terminal of the gate 22. A standard Zener diode negative voltage reference source may also be used for this purpose.

The comparator flip-flop 25 may comprise a differential amplifier with positive feedback which permits the comparator flip-flop to operate essentially as a zero crossing detector with memory. The comparator flip-flop 25 may be switched to the "on" state by the positive-going leading edge of a positive impulse function applied to the input terminal designated ON and is switched to the "off" state by the application of ground potential to the input terminal designated OFF. The state of the comparator flip-flop 25 is unaffected by negative pulses applied to either input terminal. When the comparator flip-flop 25 is switched "on", it produces a positive voltage pulse and continues to produce that pulse until it is switched "off" by the integrator output voltage $V_o$ rising to ground potential.

When the comparator flip-flop 25 switches "on", it produces a positive output pulse that opens the D.C. gate 22 thereby effecting the connection of the negative voltage source 23 to the junction 11 until the second ramp voltage $V_o$ crosses zero volts, applies ground potential to the OFF terminal of the comparator flip-flop 25 and triggers the flip-flop 25 to switch "off" whereupon its output voltage drops sharply to ground potential. This ground potential disables the gate 22 and effects the decoupling of the reference current $I_A$ from the junction 11. The aforedescribed sawtooth generating cycle repeats when the next positive pulse is applied to the ON terminal of the comparator flip-flop 25.

A constant offset current is applied to the junction 11 in order to prevent the comparator flip-flop 25 from being falsely triggered "off" by negative voltage drift in the amplifier, by noise signals on the input voltage $V_x$ or through a reversal of input voltage polarity. A reversal of input voltage polarity may be expected if the input voltage is derived from a source such as a thermocouple of the type that reverses the polarity of its output voltage in response to a temperature change from an ambient temperature condition. A reversal of input voltage polarity may also occur through an accidental reversal of the input voltage source terminals. The junction 11 may receive the offset current from a constant positive offset voltage source 26 which is connected to the junction 11 through a resistor 27. The offset voltage produced by the source 26 is designated $+V_B$ and the offset current which flows through the resistor 27 and toward the junction 11 is designated $I_B$. Again, to facilitate an understanding of this aspect of the invention, the voltage $V_B$ may be normalized to the voltage $V_x$ by assuming that the resistor 24 has a value of resistance equal to that of the resistor 12. The source 26 may be assumed to comprise a battery having a negative plate connected to ground and a positive plate connected to the corresponding side of the resistor 27. The magnitude of the offset voltage $V_B$ will be governed by such factors as the anticipated negative magnitude of the analog input voltage $V_x$ produced by a source which may undergo voltage polarity reversals, the expected amount of amplifier drift and the anticipated noise level of the input signal.

Considering now the digital circuitry, the positive pulse-width modulated pulses produced at the output of the comparator flip-flop 25 are also received by a binary divider 30 which may comprise a conventional 2-stage binary divider. The binary divider is typically designed to be driven by the negative-going trailing edges of sequential positive pulses received from the comparator flip-flop 25. An output voltage is taken from that divider stage which produces a positive step voltage when the divider 30 receives two negative-going voltage transitions and produces a step negative-going voltage when the divider receives two additional negative-going transitions or a total of four successive negative-going voltage transitions. This negative-going pulse from the divider 30 is applied to RESET terminal of flip-flop 31 to effect the resetting of that flip-flop. Thus, the flip-flop 31 is reset by the negative-going trailing edge of every fourth pulse produced by the comparator flip-flop 25.

The flip-flop 31 is driven into a set state by the negative-going trailing edge of a positive start pulse applied to its SET terminal by a conversion command signal source 32. The source 32 may comprise any conventional source of positive pulses which may, for example, be produced by operation of a key-type pulse generator, or by various other types of apparatus capable of providing a pulse output. For those applications requiring a constantly recurring digitized voltmeter readout, the source 32 may comprise a free-running multivibrator or similar type of pulse generator that operates at a relatively low frequency compared to the frequency of time base oscillator 34. The negative-going trailing edges of the positive start pulses produced by the source 32 command the digital voltmeter to start the analog-to-digital conversion of the analog input signal $V_x$. When the flip-flop 31 is set by a start pulse received from the source 32, it produces a positive step voltage which is received as one input by an A.C. gate 33. When the flip-flop 31 is reset by a negative-going pulse received from the binary divider 30, the output voltage of the flip-flop 31 drops sharply to ground potential and forms the negative-going trailing edge of the step voltage initiated by the pulse from the source 32. Thus, the positive voltage pulse appearing at the output of the flip-flop 31 has its leading edge formed by a negative-going pulse produced by the source 32 and its trailing edge formed by a negative-going output pulse produced by the divider 30. The positive voltage level of the step voltage produced at the output of the flip-flop 31 enables the gate 33 to open repeatedly and gate constant frequency positive pulses from the time base oscillator 34 into a decade counter 36.

The gate 33 comprises a dual input AND gate which is enabled by coincidental, positive voltage pulses applied to its two input terminals and is disabled by pulses of ground or negative voltage applied to either input terminal for the time interval of each ground or negative pulse. The oscillator 34 may comprise a crystal-controlled oscillator or free-running multivibrator with a capability of generating alternate zero and positive voltage pulses at precise constant time increments, the pulse widths of the equally spaced positive pulses timing the intervals during which the first and second ramps of the sawtooth waveform voltage $V_o$ are formed. The frequency of the oscillator 34 is considerably higher than the frequency of the source 32 in those instances when the source 32 is of an oscillating type and may be on the order of, for instance, 240K times the frequency of the source 32.

The counter 36 not only serves as a pulse counter but, in addition, serves as a binary divider for the pulses produced by the oscillator 34. No provision for reset need be made to the counter 36 since in accordance with this invention, the counter is not reset at any time during the conversion cycle. To provide, for example, a three digit decimal readout of the analog input signal magnitude, the counter 36 is comprised of three decade counters, each decade counter utilizing only ten of sixteen possible voltage outputs available from a conventional 4-stage binary-coded decade counter.

It will be apparent that whereas the counter 36 is illustrated as a three decade counter, it may also take the form of a counter having two or four or more intercoupled counting stages. However, since the principles of this invention are as applicable to counters having two or four or more counting stages as they are to three stage counters, for the purpose of facilitating an explanation of the invention the three stage counter will be considered as exemplary.

In the counter 36 the units decade is connected to the tens decade, the tens decade connected to the hundreds decade, such that a carry signal which advances the tens decade once is received from the units decade after ten consecutive pulses have been applied to the units decade by the oscillator 34. Upon receiving ten consecutive pulses from the units decade, the tens decade generates a carry signal that advances the hundreds decade once. Accordingly, the counter 36 divides the number of counts received from the oscillator 34 by a factor of 1000.

A digital output signal is taken from a counter output terminal 39 of the highest order decade counter and applied through a binary divider 40 and a differentiator 41 to the ON terminal of the comparator flip-flop 25. The binary divider 40 typically comprises a conventional divide-by-eight binary divider formed by three intercoupled flip-flop stages, the divider being driven by negative-going step voltages received by the counter output terminal 39. A positive-going step voltage output is taken from the highest order flip-flop stage, this stage changing state and producing a positive-going step voltage output every time the divider 40 receives eight successive negative step voltage pulses from the terminal 39.

Figure 3:
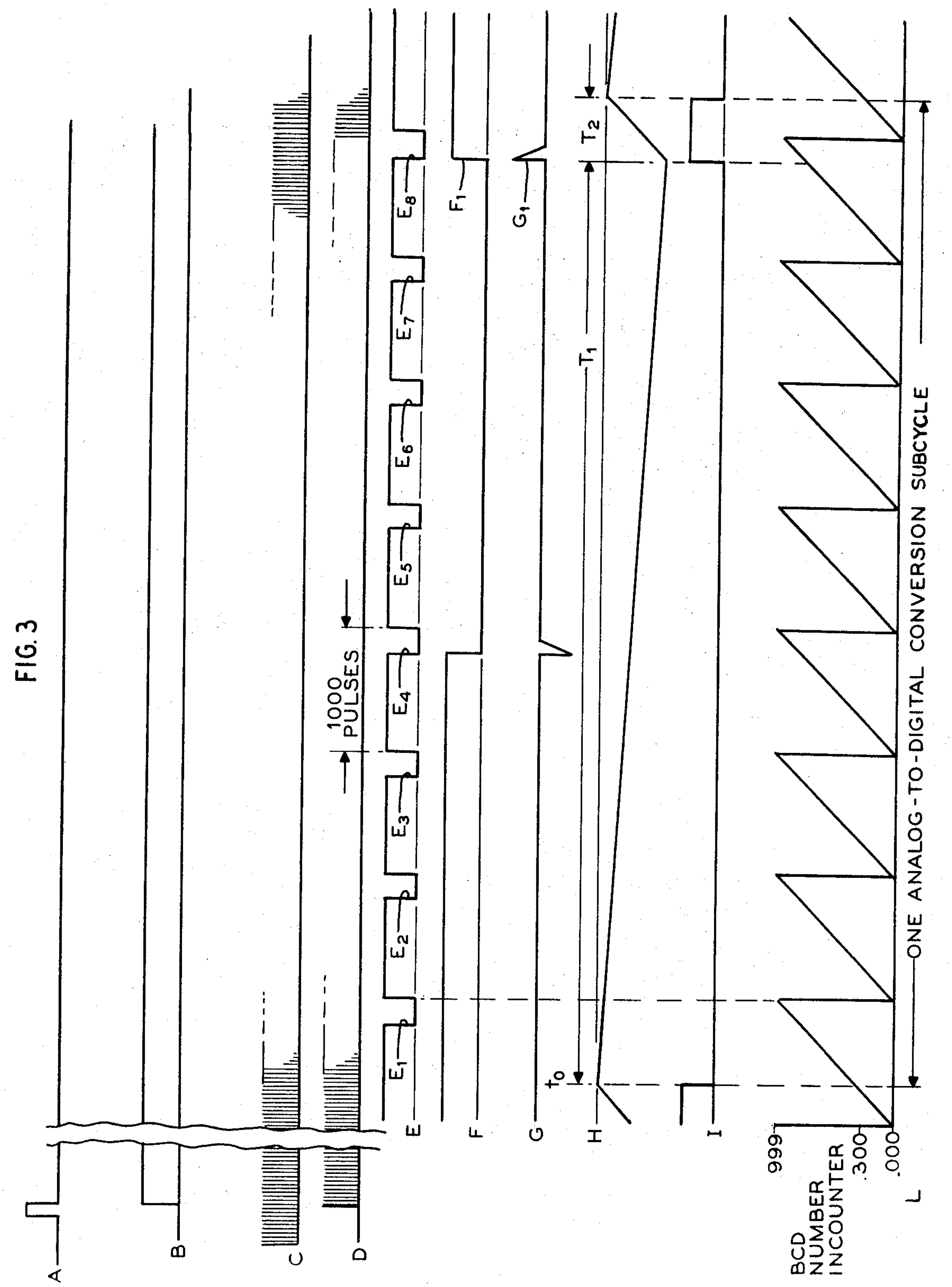

The time interval required to generate this positive-going step output voltage establishes the time interval of the first ramp voltage $V_o$; this time interval being depicted in FIG. 3H as the interval $T_1$. The differentiator 41 differentiates the negative-going and positive-going step voltages received from the binary divider 40 and produces sharp negative and positive output pulses, respectively. Negative output pulses produced by the differentiator 41 and received as input pulses by the comparator flip-flop 25 will not trigger the flip-flop 25 but the positive-going leading edge of each positive output pulse drives the comparator flip-flop 25 ON. Each time the flip-flop 25 turns ON, the level of its output voltage rises sharply to form the leading edge of a pulse width-modulated pulse. The positive voltage level of the pulse width-modulated pulse enables the gate 22 to gate the current $I_A$ to the junction 11 thereby initiating the generating of the second ramp voltage $V_o$. It will be recalled that the trailing edge of each width-modulated pulse is generated by the second ramp voltage $V_o$ crossing zero volts. The time interval during which each second ramp is formed is referred to herein as the interval $T_2$, and is also depicted in FIG. 3H.

Under steady state conditions and with the offset applied to the integrator input, the first ramp of each sawtooth waveform generated during each time interval $T_1$ has a slope of $-(V_X + V_B)/RC$, R being the resistance of the resistors 12, 24 and 27, and C being the capacitance of the capacitor 15. The second ramp of each waveform generated during the time interval $T_2$ has a slope of $V_A-(V_X + V_B)/RC$. Under these conditions, the equation $V_X + V_B\ T_2/(T_1 + T_2)$ obviously defines the relationship between the slopes of each sawtooth waveform and their corresponding time intervals $T_1$ and $T_2$. Again, assuming steady state conditions the waveform repetition period $T_O$ will not only be equal to the sum of the time intervals $T_1$ and $T_2$ forming each corresponding waveform but will also be equal to the sum of the time interval $T_2$ of one waveform and the time interval $T_1$ of the next succeeding waveform. The periodic initiation of each interval $T_2$ is effected by a predetermined number of periodically recurring digital output signals from the counter 36. With the parameters $V_A$ and $V_B$ maintained constant, the time interval $T_2$ is thus a linear function of the average magnitude of the voltage $V_X$ considered over the period $T_0$, since as will be realized, the current $I_X$ is integrated for each period $T_O$. The time interval $T_2$ is therefore representable by a pulse count that corresponds to the average value of the voltage $V_X$ and, more particularly, to the millivolt value of $V_X$ with a counter scale factor of one count per millivolt of input signal. It will be realized that the digital output of the counter 36 is independent of the gain of the amplifier 14, of the capacitance value of the capacitor 15 and of the frequency of the oscillator 34.

Since it is an object of this invention to provide a digital voltmeter having a minimum number of components, in addition to dispensing with gating and counter reset circuitry, resort is not made to conventional gates or switches which operate under the control of logic circuitry to shunt the capacitor 15 or ground the terminal 16 during periods when the voltmeter is not operated and thereby establish the desired initial conditions of operation. In contrast, the digital voltmeter of this invention is typically placed into operation with the integrator output voltage $V_o$ near or at the negative voltage level established by the diode 19 rather than at a more positive voltage level, that is, more nearly at the ground potential of the zero-volt reference level. This typical initial condition of the output voltage $V_o$ is, of course, an undesired by-product of the junction 11 being connected to a source of positive potential, including the offset voltage source 26, during periods when the voltmeter is not operated. With the voltage $V_o$ initially near or at an average negative voltage level established by the diode 19 rather than more nearly at ground potential, when the voltmeter is rendered operative, the first two or three consecutive sawtooth waveforms of the voltage $V_o$ may, and typically do, deviate from a sawtooth waveform which is exactly proportional to the time integral of the effective input signal. Deviations of the actual sawtooth waveforms from a corresponding ideal sawtooth waveform are manifested by deviations in the actual time ratio of $T_0$:$T_2$ from the corresponding ideal time ratio and, as a consequence, by initial erroneous counter outputs. Manifestly, the more rapid the convergence of the actual time ratio to the ideal time ratio, the smaller the initial errors in the digital output. Preferably, the time ratio should be great enough to provide almost exact conformance of the actual to the ideal time ratio within two or three successive conversion cycles. As will be discussed in greater detail subsequently, provision is made in the form of the binary divider 30 to automatically nullify the first two or three successive waveforms which would normally produce the largest errors in the counter output.

With a full scale input voltage $V_x$ of 1.000 volt and a corresponding full scale analog input current $I_x$ of 10 micro-amperes, and assuming a zero offset current $I_B$, a time ratio $T_O$:$T_2$ of 8:1 provides a sufficiently rapid convergence of the actual to the ideal time ratio of $T_O$:$T_2$ for at least many commercial voltmeter applications. A time ratio of 8:1 under these conditions is conveniently provided by utilizing in conjunction the divide-by-eight binary divider 40 a reference current $I_A$ of the precise amplitude required to generate a second ramp having a slope of 7:1. With a full scale analog input current $I_x$ and under steady state conditions, the average reference current $I_A$ leaving the junction 11 equals the sum of the current $I_x$ and $I_B$ entering that junction. Thus, for a full scale input current $I_x$ of 10 microamperes and with no offset current, to provide a second ramp of slope 7:1 requires a flow of 80 microamperes of current $I_A$ from the junction 11 during the interval $T_2$; 10 microamperes to equalize 10 microamperes of current $I_x$ during the interval $T_2$ plus 70 microamperes to equalize in the interval $T_2$ the prior application of 10 microamperes during each of 7 previous time intervals forming the period $T_1$. Under these conditions, the total current flowing from the junction 11 will have a value of 70 microamperes or seven times the amplitude of the assumed full scale input current $I_x$. Hence, the second ramp of the sawtooth waveform will have a slope of 7:1 and will cross zero volts in an interval $T_2$ that is equal to the final one-eighth interval of the repetition period $T_O$. The gating of the current $I_A$ to the junction 11 during the final one-eighth of the repetition period $T_O$ to provide the desired 8:1 ratio of $T_O$:$T_2$ and the desired 7:1 ratio of $T_1$:$T_2$ is conveniently effected by a divide-by-eight binary divider 40 because under steady state conditions and with a nominal full scale analog input voltage and no offset voltage or current, the divider 40 produces a positive step voltage for triggering the flip-flop 25 and initiating the period $T_2$ after the counter 36 undergoes seven full-scale repetitive counting cycles with each cycle representing 1,000 consecutive counts for a total of 7,000 counts. It will be appreciated that under these conditions the counter 36 would supply the divider 40 with an initial negative step voltage input as a result of undergoing full-scale recycling at the termination of the time interval $T_2$ of the previous conversion cycle. This step voltage input obvioust y has no count value attributable to it in the interval $T_1$ but adds to the next seven successive negative step voltages to provide the required eight successive negative-going pulses or binary inputs for the divider 40 in the interval $T_1$. Accordingly, the interval $T_2$ is initiated 7,000 counts after the initiation of the interval $T_1$ and with a nominal full-scale input of, for example, 1,000 millivolts the second ramp will, in the interval $T_2$, cross zero volts when the counter 36 receives an additional 1,000 counts. Hence, the desired ratio of 7:1 with the aforedescribed input voltage conditions is provided. Obviously, certain voltmeter applications may require that the time ratio of $T_O$:$T_2$ be other than 8:1 with a full-scale input signal. For such applications, a binary divider providing the desired time ratio may be substituted for the aforedescribed divide-by-eight binary divider 40 and the magnitude of the reference current $I_A$ proportionately increased or decreased to provide a return to the zero volt level of the second ramp within the same interval of time that the time interval $T_2$ is required to bear to the repetition period $T_O$.

It will be recalled that in the embodiment wherein the integrator is offset the voltage which appears at the junction 11 includes not only the analog input voltage $V_X$ but also includes the normalized offset voltage $+V_B$. With $V_B$ applied to the integrator input, the slope of the ramping component generated during each period $T_O$ will be $-(V_X + V_B)/RC$ as indicated above; not merely $-(V_X)RC$, as it would be were only $I_x$ integrated. Hence, at the beginning of a $T_2$ interval, $V_O$ will be offset by a voltage proportional to the absolute magnitude of $V_B$ integrated for $T_O$. For most applications, it is preferred that the display 37 readout as a decimal number only the voltage magnitude or the measured input voltage $V_X$. With the known reference current $I_R$ applied to the integrator for an appropriate time increment of the $T_2$ interval, the time integral of the reference current can be made equal in magnitude to the time integral of the offset current before the end of the $T_2$ interval. By thus equating the two time integrals, the offset signal time integral is nullified by the reference current time integral and thereby eliminated from the value of $V_X$ displayed at the end of the $T_2$ interval. An appropriate fixed increment for the $T_2$ interval is established as a fixed number of counter 36 pulse counts since this counter times the application of the reference current to the integrator. To compensate for the offset current $I_B$ in the illustrated embodiment, the initiation of the intervals $T_1$ and $T_2$ (and hence the application of the reference current $I_A$ to the integrator input) are advanced in time relative to the state of the counter 36 by a count increment which is proportional to the normalized ratio of the offset current to the nominal full-scale current thereby providing the fixed time interval of integrating $I_A$ before the counter returns to its initial counting state to nullify the offset integrated for the period of $T_0$ counts. By advancing in time the initiation of the intervals $T_1$ and $T_2$ relative to the state of the counter, the inflection point of waveform is advanced by an equal time interval. Since the slope of the second ramp will not change for a given magnitude of input signal, the point of zero crossing will be correspondingly time-advanced by the same time interval and the disabling of the gate 33 will be advanced by the same time interval and, hence, the counts registered by the counter 36 will be reduced by a numeric count equal to that time interval. Thus, the count which is registered by the counter at the initiation of the interval $T_2$, that is, the time when the sawtooth waveform peaks is less than the count capacity of the counter 36 by a count equal to the count value of the offset current.

To illustrate, assume that the analog input voltage $V_X$ is removed from the junction 11 and that an offset current $I_B$ of 2 microamperes, derived from a normalized offset voltage of +200 millivolts, flows into that junction. To compensate for this 20 percent increase in the effective input current and voltage, the initiation of the intervals $T_1$ and $T_2$ are advanced equally by 200 counts, thereby establishing a fixed time interval of 200 counts before the counter recycles for the exemplary 80 microampere reference current $I_A$ (the time integral of the reference current) to nullify the exemplary 2 microampere offset current $I_B$ integrated for 8,000 counts (the time integral of the offset current.) Thus, in the voltmeter of FIG. 1, each interval $T_1$ will now be represented by 7,800 counts rather than 8,000 counts with zero volts of $V_X$ and each interval $T_2$ will now be represented by 200 counts instead of a zero count with zero volts of analog input signal.

If it is further assumed that in addition to the +200 millivolts of offset voltage the junction 11 receives an analog input current $I_X$ of 3 microamperes, normalized to +300 millivolts of input voltage $V_X$, each interval $T_1$ would then be equal to 8,000 counts minus 500 counts or 7,500 counts and the interval $T_2$ would then be equal to 300 counts plus 200 counts or 500 counts. Also, assuming that the counter 36 is operated as a three decade decimal counter with a pulse count capacity of 1,000 counts, a pulse is taken from the counter which will advance initiation of the intervals $T_1$ and $T_2$ by a count increment equal to the millivolt value of the offset voltage $V_B$. Continuing with the above example, to provide the required advancement of intervals $T_1$ and $T_2$ requires that the counter 36 produce an output pulse in the form of a negative-going voltage transition upon receiving 800 successive pulse counts. The counter output pulse is available by utilizing, for instance, an 8-4-2-1 binary-coded decimal counter comprised of four intercoupled flip-flop binary counting stages. The terminal 39 may then be connected to the highest order flip-flop stage of the hundreds decade counter since this stage is capable of producing a negative-going voltage output when eight successive carry signals are received by the hundreds decade. Inasmuch as positive logic is used throughout this specification, the negative-going output voltage from the hundreds decade is representative of a decimal number output of $\overline{8}$ (NOT 8) and time-advances the positive pulse produced by the binary divider 40, and hence, the initiation of each of the intervals $T_1$ and $T_2$ by 200 counts.

It will be apparent to those working in the art that it is possible to provide a plural-stage binary counter and a binary logic code which when used with the counter causes it to generate a reference gating signal at the terminal 39 that will either advance or retard in time the initiation of the intervals $T_1$ and $T_2$ and, thus, compensate for virtually any normalized value of offset voltage, positive or negative.

Figure 2:
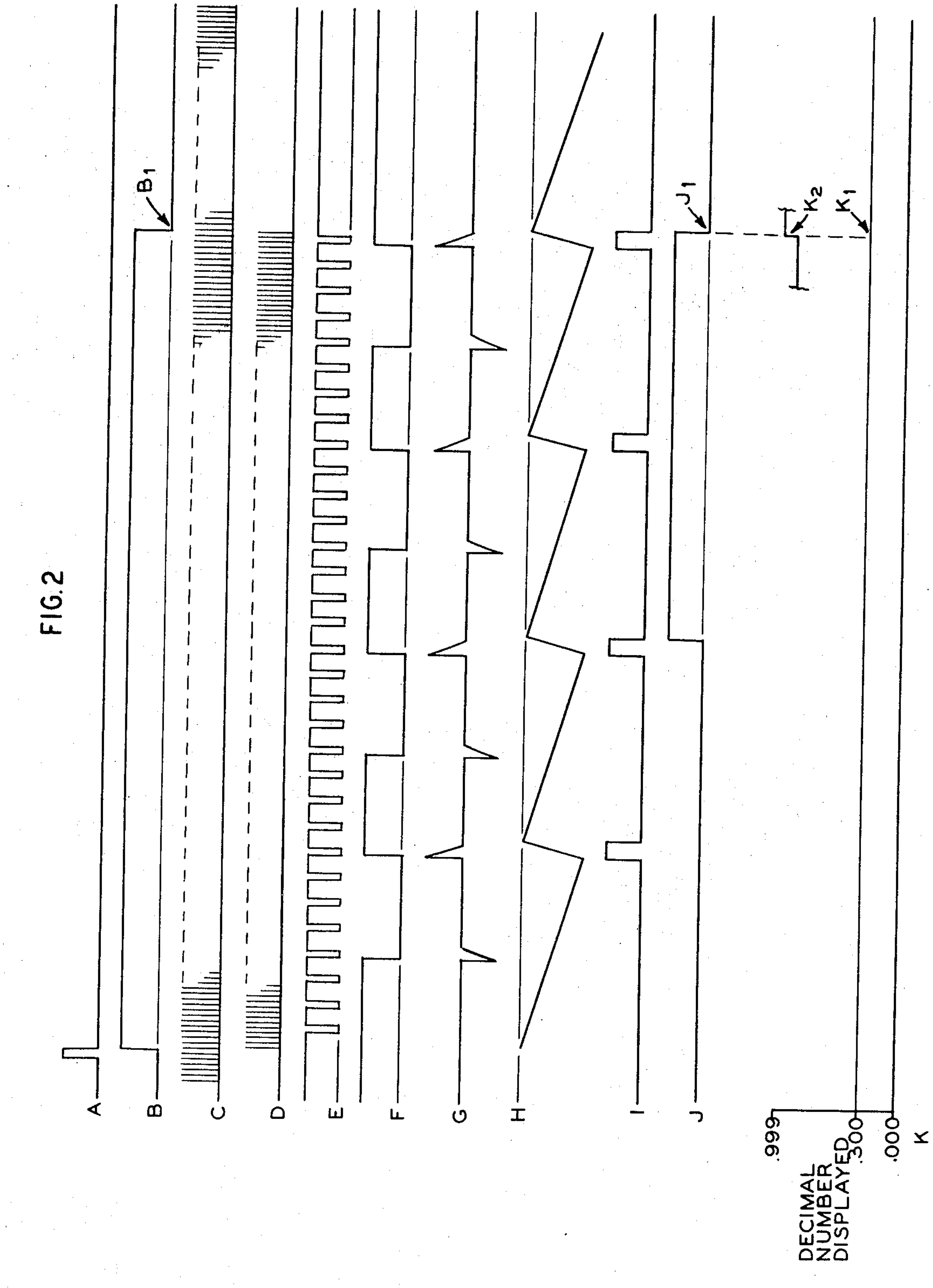

With a divide-by-four binary divider 30 in the voltmeter circuit, the purpose of which being disclosed in detail subsequently, each complete analog-to-digital conversion cycle comprises four successive conversion subcycles. The negative-going trailing edge of a positive start pulse produced by the conversion command signal source 32, FIGS. 2A and 3A, initiates each complete conversion cycle by initiating the first of the four consecutive conversion subcycles. More specifically, the trailing edge of this start pulse triggers the flip-flop 31, FIG. 1, to the SET state causing the flip-flop output voltage to rise as a positive step voltage, FIGS. 2B and 3B. The positive level of this step voltage enables the gate 33 to transmit positive pulses having equal time separations, FIGS. 2C and 3C, from the oscillator 34 to the counter 36. The pulses received by the counter 36 are depicted in FIGS. 2D and 3D. The flip-flop 31 remains in the SET state during four consecutive conversion cycles. At the termination of the fourth cycle the binary divider 30 generates a negative-going voltage transition, designated $J_1$ in FIG. 2J, which is received by the RESET input of flip-flop 31 and triggers the flip-flop into its reset state whereupon its output voltage drops sharply to ground potential and disables the gate 33. The disabled gate 33 blocks the train of pulses from the oscillator 34 to the counter 36 permitting the counter to stabilize.

The same negative-going step voltage $J_1$ at the output of the binary divider 30 is also applied as a triggering pulse to a buffer storage register or unit 43 so that the binary-coded decimal number which is registered at that time by the counter 36 is transferred into the register 43.

The register 43 includes individual and generally identical units, tens and hundreds buffer storage registers or units which are respectively coupled to the units, tens and hundreds decade counters forming the counter 36. The storage registers are of conventional type formed, for example, by flip-flops corresponding in number to the number of flip-flops of their corresponding decade counter.

Each flip-flop embodied in the register 43 may be a J-K type of flip-flop having "set," "trigger" and "clear" input terminals. The "trigger" input terminals of all the J-K flip-flops are connected together in parallel to receive simultaneously the negative-going voltage $J_1$ from the divider 30. The "set" input terminal of each buffer flip-flop is connected to the 1 output terminal of its corresponding counter flip-flop and each "clear" input terminal is connected to the 0 output terminal of the same corresponding counter flip-flop. If the J-K flip-flops are operated in this mode, the set and clear input terminals are employed only to transfer the binary coded information from the counter flip-flops into the J-K flip-flops of the buffer storage 43. The application of the voltage $J_1$ to all the trigger input terminals of the buffer storage flip-flops drives all of these flip-flops to assume respective binary states corresponding to the 0 or 1 binary states of their corresponding counter flip-flops. The buffer storage flip-flops remain in such binary states until the next negative-going voltage transition $J_1$ is received from the divider 30.

To convert the binary-coded decimal number stored in the buffer storage 43 to a decimal-coded driving voltage for a decimal number display 37, a binary-coded decimal-to-decimal decoder 38 formed by units, tens and hundreds decoders is coupled to receive the binary-coded information stored in the flip-flops of the corresponding units, tens and hundreds buffer storage units, respectively. The individual decoders are also of conventional type and typically incorporate identical logic circuitry to effect a binary-coded decimal-to-decimal conversion of the voltage signal stored in the buffer register 43. The display 37 may take the form of a plurality of cold cathode gas tubes, with the number of tubes being equal in number to the number of counter decades. Each tube incorporates ten cathodes in the shape of the numerals 0–9, inclusive, with one of the ten cathodes being individually illuminated by a corresponding output voltage from its corresponding decoder unit.

To preclude the possibility of the signal $J_1$ triggering the buffer storage before the counter has had sufficient time to stabilize, the signal $J_1$ which is to be applied to the buffer storage may be time-delayed long enough to ensure counter stabilization before the transfer operation. In such case, the time delay imparted to the buffer storage triggering signal $J_1$ should be longer than the sum of the time delays which might prevent instant stabilization of the counter 36. Accordingly, the time delay should be longer than the sum of the time delays introduced by the flip-flop 31, the gate 33 and the flip-flops forming the counter 36. Such delays are normally on the order of a fraction of a microsecond and therefore a simple delay circuit, such as a single section of an inductance-capacitance delay line will normally suffice.

SUMMARY OF OPERATION

An understanding of the overall operation of the digital voltmeter of this invention is believed facilitated by assuming exemplary values for the analog input voltage $V_X$ and the offset voltage $V_B$. Thus, continuing with the previously used exemplary values of these parameters, $V_X$ will be assumed equal to +300 millivolts and the normalized offset voltage $V_B$ will be assumed equal to +200 millivolts. Correspondingly, the current $I_X$ will be assumed equal to 3 microamperes and the current $I_B$ assumed equal to 2 microamperes. Moreover, it will also be assumed that the voltmeter has attained a steady state condition of operation and is now terminating one of the four consecutive analog-to-digital conversion subcycles, FIG. 3H, at time $t_0$.

To advance the peaking of the sawtooth waveform of the integrated output voltage $V_o$ by 200 counts, FIG. 3H, and thereby compensate for the assumed offset current of 2 microamperes, the terminal 39 is connected to receive a negative-going step voltage, designated $E_1$ in FIG. 3E, when the counter 36 registers a binary-coded decimal number corresponding to the decimal number 0.800. The voltage at the terminal 39 remains at the more negative potential for an additional 200 counts and then rises as a positive-going step voltage, FIG. 3E, as a result of counter 36 going through a binary counting transition which provides a decimal display number of 0.000. Successive negative-going step voltages are designated $E_2$, $E_3$ . . . $E_8$ and are produced at intervals of 1,000 counts, for reasons which will be apparent. When the terminal 39, FIG. 1, receives the eighth negative-going step voltage, the binary divider 40 produces a positive-going step voltage $F_1$, FIG. 3F, which is converted by the differentiator 41 into a positive spike pulse $G_1$, FIG. 3G, and applied to the ON input terminal of the comparator flip-flop 25 to turn that circuit "on".

When the comparator flip-flop 25 turns "on", its output voltage rises sharply to define the leading edge of a step voltage pulse, FIG. 3I. The positive voltage level of this pulse enables the gate 22 and causes a flow of current $I_A$ having a magnitude of appropriate value, for instance, 80 microamperes; this value of reference current being appropriate for reasons related hereinabove. The current $I_A$ flowing from the junction 11 initiates the generation of the second ramp of the sawtooth voltage $V_o$ for the interval $T_2$. The intervals $T_1$ and $T_2$ of the sawtooth voltage waveform are respectively designated as such in FIG. 3H.

The interval $T_1$ is equal to a count of 7,500 because with 300 millivolts of analog input signal 7,500 consecutive pulses from the oscillator 34 are required to generate eight negative-going voltage pulses at the terminal 39 after the gate 33 is enabled. Since $T_1$ plus $T_2$ always equal 8,000 counts for each sawtooth waveform in the aforedescribed embodiment of the invention, it will be apparent that the interval $T_2$ is initiated 200 counts sooner than it would have been had compensation not been made for the 2 microamperes of offset current. Thus, the initiation of the interval $T_2$ coincides in time with the receiving by the counter 36 of 800 pulses rather than 1,000 pulses. By advancing the interval $T_2$ by 200 counts, the time that the second ramp crosses zero volts is accordingly advanced 200 counts. Therefore, the second ramp crosses zero volts when the counter 36 registers a pulse count, which in binary-coded decimal form, represents the number 300, as illustrated by FIG. 3L.

The zero crossing of the second ramp voltage is detected by the comparator flip-flop 25 which is triggered into changing state by the application of zero volts to its OFF input terminal. As a result, the voltage output of the comparator flip-flop 25 drops sharply and forms the negative-going trailing edge of the pulse $B_1$. In the time domain, the width of this pulse is equal to the interval $T_2$ or to 500 counts, this count corresponding to the sum of the millivolt values of the voltages $V_X$ and $V_B$.

The negative-going tailing edge of the fourth consecutive pulse produced by the comparator flip-flop 25, FIG. 2I, following the triggering of the flip-flop into its set state, causes the binary divider 30 to produce the negative-going step output voltage $J_1$, FIG. 2J. This voltage is applied to the RESET input of flip-flop 31 and triggers the flip-flop to reset whereupon its output voltage drops sharply to ground potential as indicated at $B_1$ in FIG. 2B. The gate 33 is disabled by the application of ground potential to its corresponding input terminal until the flip-flop 31 is triggered again into the set state by a pulse from the source 32. With the gate 33 disabled, counting pulses produced by the oscillator 34 are blocked from the counter 36 which thereupon stabilizes.

The negative-going step voltage $J_1$, FIG. 2J, is also applied to the trigger inputs of the flip-flops comprising the storage register 43 to transfer into this register the pulse count which is now in the stabilized counter. The count stored in the register 43 is applied to the decoder 38 and, hence, to the display 37 which thereupon displays the decimal number 0.300, FIG. 2K, corresponding to the assumed 300 millivolt value of the analog input signal.

The storage register 43 holds the displayed number until the next $J_1$ signal, produced at the termination of a succeeding complete conversion cycle is applied to the register 43. Thus, the displayed number persists, as shown by the straight, horizontal line designated $K_1$ in FIG. 2K, until the next conversion command signal is received by the converter. The number so displayed remains for an additional period of time equal to the time period of a succeeding complete conversion cycle. If a periodic sampling of the analog input signal magnitude is desired, a free-running multivibrator or a crystal-controlled oscillator that operates at the desired sampling frequency may be used as the source 32. This sampling frequency as mentioned hereinabove, is considerably lower than the frequency of the time base oscillator 34. Changes in amplitude of the analog input signal, which is typically a slowly varying D.C. signal, will be reflected by corresponding greater or lesser number of pulses being counted during the time interval $T_2$, FIG. 3H, for obvious reasons, and will be reflected by a corresponding change in the binary-coded decimal number which is transferred form the counter 36 to the register 43 and hence to the display 37. For example, a slight increase in the magnitude of the analog input signal will cause a corresponding increase in the number of pulses received by the counter 36 at the termination of each conversion subcycle and will be reflected by an abrupt and corresponding increase in the numerical value of the decimal number displayed by the display 37 at the termination of the corresponding complete version cycle. The abrupt increase in the value of the displayed number is illustrated by the step departure at $K_2$ from the straight line $K_1$ in FIG. 2K. The step at $K_2$ obviously will be oppositely directed if the magnitude of the analog input signal decreases before the sampling thereof.

The sawtooth waveform, illustrated in FIG. 3H, is an ideal sawtooth waveform in that it is devoid of transients and has a time ratio of $T_0$:$T_2$ which is exactly proportional to the average magnitude of the input signal.

Figure 4:
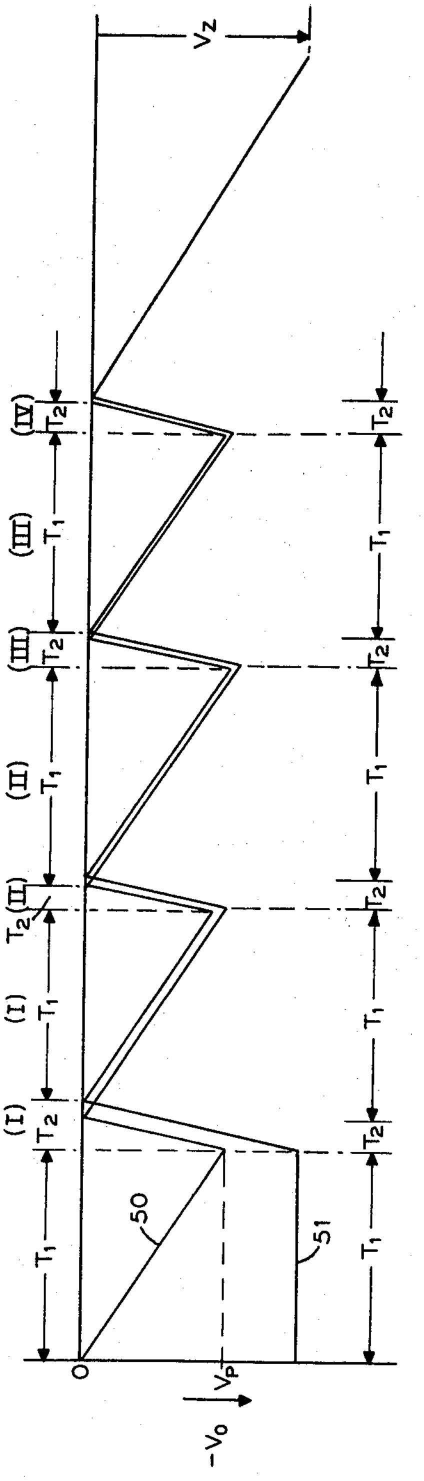

FIG. 4 illustrates four consecutive sawtooth waveforms 50 generated by the specific embodiment of the voltmeter described above under steady state conditions, these waveforms representing exactly a nominal full-scale analog input voltage of 1.000 volt with no offset current $I_B$. The ratio of $T_1$:$T_2$ is thus exactly 7:1 for each of these four waveforms. In contrast, waveform 51 illustrates four typical transient waveforms generated under nonsteady state conditions. As mentioned hereinabove, nonsteady state conditions typically arise when the voltmeter is initially put into operation with the voltage $V_o$ at the over-range negative voltage level established by the Zener diode 19. Thus, the first ramp of the first actual sawtooth waveform 51, starting at a negative voltage $V_z$ established by the reverse breakdown voltage of the diode 19, may have practically zero slope for the entire first $T_1$ interval. As a result, the peak of the first actual waveform will be more negative than the peak of the ideal waveform by an amount equal to the difference between the voltage $V_z$ and the ideal peak voltage illustrated by the waveform 50 and designated $V_p$. The slope of the second ramp of the actual sawtooth waveform 51 parallels that of the second ramp of the ideal waveform 50 but because the second ramp of the waveform 51 starts at a more negative voltage level, the slope of the second ramp of the waveform 51 will be offset, or delayed in time, from the slope of the ideal waveform 50 by a significant percentage of the ideal interval $T_2$, as indicated by $T_2$(I). The transient overshoot which occurs when the second ramp returns to zero volts during this cycle causes a decrease in the actual value of the interval $T_2$(II) from the ideal interval $T_2$ in the second successive sawtooth waveform. Conversely, the transient undershoot which occurs during the formation of the second sawtooth waveform generates a transient overshoot in the interval $T_2$(III) of the third successive sawtooth waveform. The overshoot which occurs in the third sawtooth cycle is transmitted as an undershoot to the fourth successive sawtooth waveform so that the actual interval $T_2$(IV) of the fourth sawtooth waveform is shorter than the ideal interval $T_2$. The relationships between the actual intervals $T_2$(I), $T_2$(II), $T_2$(III) and $T_2$(IV) as functions of the ideal interval $T_2$ for any ratio $T_1$:$T_2$with or without offset current are expressed by the following four equations:

(1) $$T_2(I) = T_{2\text{IDEAL}}\left(\frac{V_Z}{V_P}\right)$$

(2) $$T_2(II) = T_{2\text{IDEAL}}\left(1+\frac{V_Z - V_P}{(-T_1/T_2)^1 V_P}\right)$$

(3) $$T_2(III) = T_{2\text{IDEAL}}\left(1+\frac{V_Z - V_P}{(-T_1/T_2)^2 V_P}\right)$$

(4) $$T_2(IV) = T_{2\text{IDEAL}}\left(1+\frac{V_Z - V_P}{(-T_1/T_2)^3 V_P}\right)$$

where $V_P$ is the peak negative voltage of the corresponding ideal sawtooth waveform or the voltage $V_o$ of this waveform at the initiation of the interval $T_2$. As an examination of these equations and FIG. 4 will bear out, for each successive cycle the numerator, $V_z - V_P$, of the fractional part of equations (2), (3) and (4) remains constant for a given input signal but the denominator of the corresponding fraction part of each of these equations will increase by a factor of $T_1:T_2$. By providing a large enough ratio of $T_1:T_2$, the convergence of the actual waveform to the ideal waveform may be made rapid enough so that for most voltmeter applications the deviation which exists between the two waveforms in the fourth repetititve cycle is small enough to be disregarded. By increasing the ratio of $T_O:T_2$ from, for example, 8:1 to 16:1, the convergence between the actual and ideal waveform obviously becomes more rapid thereby permitting the use of, for example, a divide-by-three binary divider 40 rather than a divide-by-four divider.

While there has been described what is at present considered to be one embodiment of this invention, it will be obvious to those skilled in the art that various changes and modifications may be made in the instrument without departing from the invention, and it is, therefore, intended to cover all such changes and modifications as fall within the true spirit and scope of the invention.

I claim:

1. An analog-to-digital converter comprising: integrating means, a source of clock pulses, a source of reference signal poled relative to an analog signal supplied to said integrating means for integration thereby, so as to reverse the sign of the slope of the waveform produced at the integrating means output in response to the analog signal applied to the integrating means input, means for counting the clock pulses to measure a time period during which the analog signal is integrated by said integrating means, and means responsive to the pulse counting means for applying said reference signal to the input of said integrating means for integration for a variable time interval which includes a fixed time interval to provide at least a predetermined time integral of the reference signal, the pulse counting means also measuring the interval during which said reference signal is integrated by said integrating means to provide a digital representation of the analog signal magnitude, means applying an offset signal of predetermined value to the input of said integrating means for at least part of said time period to provide a predetermined time integral of offset signal integration proportional to the predetermined time integral of the reference signal whereby said digital representation by said counting means is that of said analog signal magnitude independent of said offset signal.

2. Electrical signal conversion apparatus comprising: integrating means, first, second and third sources of electrical signals, first means for feeding the first signal to said integrating means for a first fixed time interval, second means operative to selectively feed the second signal to said integrating means in a sense opposite that of the first signal, timing means for operating said second means to feed said second signal to said integrating means for at least a second fixed time interval and for timing the interval of second signal integration to provide a time representation of the first signal magnitude, third means for feeding the third signal having a predetermined value to said integrating means for a third fixed time interval at least part of which precedes the integration of said second signal for providing a predetermined signal offset thereto, said second fixed time interval and the value of the third signal being selected so that the time integral of the third signal is proportional to the time integral of the second signal.

3. Apparatus according to claim 2 wherein the polarity of said third signal is the same as the normal polarity of said first signal, and wherein said timing means time advances the operating of said second means relative to said first time interval by said third time interval.

4. A dual-slope analog-to-digital representation of an analog signal magnitude comprising, a source of reference signal of opposite sense to the input signal, input and reference signal integrating means, a source of clock pulses, a pulse counter drivable by the clock pulses transmitted thereto, start means for initiating the transmission of pulses to the pulse counter, a detector connected to the integrating means for producing an output signal in response to the output potential of the integrating means ramping in one direction to a datum level, a switching device operative in response to a registration by said pulse counter of a predetermined count to terminate a first and fixed time interval during which the integrating means generates a first output potential component which ramps away from said datum level with a slope proportional to the analog signal magnitude and to apply the source of reference signal to said integrating means, said integrating means generating an output potential in response to said reference signal which ramps in said one direction towards said datum level for a second and variable time interval with a slope proportional to the reference signal magnitude, the second time interval being timed by the clock pulses to provide a digital representation of analog signal magnitude, a signal source for applying a second signal to said integrating means at least during the generation of said first output potential component, said integrating means thereby integrating the second signal for said fixed time interval to provide a fixed time interval of said second signal integration, said predetermined count of said counter being equal to the full pulse count capacity of said counter less than the number of pulse counts corresponding to the magnitude of said second signal, said counter including a counting stage for producing an output signal for operating said switching device when said counter registers said predetermined count, whereby said integrating means integrates the reference signal for a fixed time increment of said variable time interval as determined by said number of pulse counts to provide at least a fixed time integral of reference signal integration which nullifies the time integral of second signal integration, and means coupling said switching device to said counting stage.

5. Apparatus for providing a digital display representative of the magnitude of an analog signal comprising, linear signal integrating means having an input and an output, sources of respective first, second and third analog signals, first means for feeding the first signal to the integrating means input whereby the integrating means output is driven by said first signal in one direction away from a signal level in a first and fixed time interval, second means coupled to the second analog signal source for feeding the second analog signal to the integrating means input in response to a control signal applied to said second means, the second signal having a polarity such as to drive said integrating means output toward said signal level in a second time interval which varies as a function of the first signal magnitude, third means for feeding the third signal to said integrating means input during a second time interval thereby producing a fixed third signal time integral, a pulse counter comprising a plurality of interconnected pulse counting stages one of said counting stages producing said control signal for said second means, a source of clock pulses for driving said counter to time the first and second time intervals, means coupled to said integrating means output and to said counter for providing a digital display representative of the count in said counter when said integrating means output is restored to said signal level, the one counting stage being coupled to said second means and selected so that the counter counts a predetermined number of clock pulses proportional to the time integral of the third signal after producing said control signal to thereby provide a second signal time integral which nullifies the third signal time integral, whereby the digital display is representative of the first signal magnitude exclusive of the magnitude of the third signal when said integrating means output is restored to said signal level.

6. The apparatus as claimed by claim 5 wherein said third means comprises a conductor connected to said integrating means input for continually feeding said third signal thereto during said first and second time intervals.

7. An analog-to-digital converter comprising, a source of analog input signal, integrating means for generating at least two sequential output voltage signals of sawtooth waveform relative to a datum signal level during each complete analog-to-digital conversion cycle, each waveform being formed by first and second ramps having slopes of opposite sign, means coupling the analog signal source to said integrating means for at least the total time required to generate the two sawtooth waveforms, means for generating a train of clock pulses having equal time intervals between pulses, pulse counting means including plural intercoupled binary counter stages for producing output binary signals representative of the number of clock pulses received by said counting means, pulse gating means for gating clock pulses from the pulse generating means to said counting means and for blocking the transmission of clock pulses to said counting means in response to a disabling signal applied to said gating means, the frequency of the clock pulses being sufficiently high to drive at least one of said binary counter stages through a series of repetitive counting cycles within the time interval of each first ramp generation, the one counter stage thereby producing a series of pulse signals representing the number of clock pulses received by said counting means during the time interval of each first ramp and producing at least two series of pulse signal during each complete conversion cycle, bistable comparator means having at least two input terminals and an output terminal and two stable states, one of the two comparator means input terminals being coupled to receive the output signals generated by said integrating means, first binary divider means coupling the other comparator means input terminal to said one binary counter stage and producing a divider output signal upon receiving each series of pulse signals from said one counter stage, said comparator means being driven into one of said two stable states by the application thereto of a divider output signal from said first binary divider means and thereby producing at least two sequential first comparator output signals during each complete conversion cycle, means coupled to the output terminal of said comparator means and responsive to each first comparator output signal for coupling to the said integrating means a reference input signal of opposite polarity to the first input signal and of sufficient magnitude to terminate the generation of each first ramp and to initiate the generation of each second ramp, said comparator means being successively driven into the other stable state in response to each second ramp crossing the said datum signal level, said means coupled to the output terminal of said comparator means being additionally responsive to each second comparator output signal for decoupling the reference input signal from said integrating means so as to terminate the generation of each second ramp, and second binary divider means coupled to the output terminal of said comparator means for applying a disabling signal to said gating means upon receiving at least two sequential second comparator output signals so as to automatically terminate said conversion cycle, said pulse counting means thereupon providing an output signal representative of the time integral of the analog signal magnitude.

8. The converter as claimed in claim 7, wherein the first binary divider means comprises at least a divide-by-eight binary divider.

9. The converter as claimed in claim 8, wherein said second binary divider means comprises a divide-by-four binary divider.

10. The converter as claimed in claim 7, which further includes means for decoding the output signals of said pulse counting means into decimal-coded output signals, and display means coupled to the decoding means and driven by the decimal-coded output signals to provide a decimal number indication of the analog signal magnitude.

11. The converter as claimed in claim 10, which further comprises, means for applying a third input signal of constant magnitude to said integrating means, and wherein said one counter stage is selected to advance each pulse signal in time by an interval corresponding to the magnitude of the third signal.

* * * * *